(12) United States Patent
Kolbeck et al.

(10) Patent No.: US 7,075,300 B2
(45) Date of Patent: Jul. 11, 2006

(54) MAGNETIC RESONANCE APPARATUS HAVING A BULGED INTERIOR BORE FILLED WITH A MASS AUGMENTATION

(75) Inventors: Thomas Kolbeck, Kalchreuth (DE); Lothar Schön, Neunkirchen (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 47 days.

(21) Appl. No.: 10/891,344

(22) Filed: Jul. 14, 2004

(65) Prior Publication Data
US 2005/0030030 A1   Feb. 10, 2005

(30) Foreign Application Priority Data
Jul. 14, 2003   (DE) ............... 103 31 809

(51) Int. Cl.
*G01V 3/00* (2006.01)
*G01F 7/02* (2006.01)

(52) U.S. Cl. .................... 324/318; 324/320; 335/296

(58) Field of Classification Search .............. None
See application file for complete search history.

(56) References Cited

U.S. PATENT DOCUMENTS

| | | | | |
|---|---|---|---|---|
| 6,462,547 B1 | 10/2002 | Heid et al. | ................. | 324/318 |
| 6,501,275 B1 * | 12/2002 | Westphal | ..................... | 324/319 |
| 6,531,870 B1 | 3/2003 | Heid et al. | ................. | 324/318 |
| 6,552,543 B1 | 4/2003 | Dietz | ........................ | 324/318 |
| 6,642,717 B1 * | 11/2003 | Dietz et al. | ................. | 324/318 |
| 6,842,005 B1 * | 1/2005 | Schuster | ..................... | 324/318 |
| 6,952,099 B1 * | 10/2005 | Renz et al. | ................. | 324/318 |
| 2002/0008516 A1 * | 1/2002 | Dietz et al. | ................. | 324/318 |
| 2004/0046555 A1 | 3/2004 | Schuster et al. | ........... | 324/318 |
| 2004/0113618 A1 * | 6/2004 | Schuster | ..................... | 324/318 |
| 2004/0113619 A1 * | 6/2004 | Schuster et al. | ........... | 324/318 |
| 2005/0030030 A1 * | 2/2005 | Kolbeck et al. | ........... | 324/318 |
| 2005/0030031 A1 * | 2/2005 | Nistler et al. | .............. | 324/318 |
| 2005/0040826 A1 * | 2/2005 | Renz et al. | ................. | 324/318 |
| 2005/0073311 A1 * | 4/2005 | Nistler et al. | .............. | 324/318 |
| 2005/0206381 A1 * | 9/2005 | Nistler et al. | .............. | 324/318 |

* cited by examiner

Primary Examiner—Diego Gutierrez
Assistant Examiner—Tiffany A Fetzner
(74) Attorney, Agent, or Firm—Schiff Hardin LLP

(57) ABSTRACT

A magnetic resonance apparatus has a basic field magnet with an interior bore having a bulge therein. A mass augmentation device is disposed in the bulge, and is composed of a number of assembled individual segments. The mass augmentation device reduces the propagation of mechanical oscillations that are produced during operation of the magnetic resonance apparatus, and which otherwise would produce unwanted noise.

21 Claims, 2 Drawing Sheets

MAGNETIC RESONANCE APPARATUS HAVING A BULGED INTERIOR BORE FILLED WITH A MASS AUGMENTATION

BACKGROUND OF THE INVENTION

1. Field of the Invention

The invention concerns a magnetic resonance apparatus.

2. Description of the Prior Art and Related Subject Matter

Magnetic resonance technology is a known technology to, among other things, acquire images of the inside of a body of an examination subject. In a magnetic resonance device, rapidly switched gradient fields that are generated by a gradient coil system are superimposed on a static basic magnetic field that is generated by a basic field magnet. Furthermore, the magnetic resonance device has a radio-frequency system that radiates radio-frequency energy into the examination subject to excite magnetic resonance signals, and acquires the magnetic resonance signals, on the basis of which magnetic resonance images are generated.

To generate gradient fields, appropriate currents are set in the gradient coils of the gradient coil system. The amplitudes of the required currents are up to more than 100 A. The current rise and fall rates are up to more than 100 kA/s. The basic magnetic field interacts with these temporally changing currents in the gradient coil to produce Lorentz forces on the order of 1 T, which lead to oscillations of the gradient coil system. These oscillations are propagated via various propagation paths at the surface of the magnetic resonance device. The mechanical oscillations are there transduced into sound vibrations that subsequently lead to an undesired noise.

From German OS 199 27 494, a tube-shaped gradient coil system for a magnetic resonance apparatus having rings at its ends similar to the tube cross-section and made from high-density materials. The rings are firmly connected with the gradient coil system for noise reduction.

From German OS 101 56 770, discloses a magnetic resonance apparatus with a gradient coil system in which an electrically-conductive structure is arranged and fashioned such that, at least within the imaging volume of the magnetic resonance apparatus, the magnetic field caused by a gradient field due to induction effects is configured geometrically similar to the gradient field. In an embodiment, at least one part of the structure is barrel-shaped as a component of a basic field magnet. Among other things, the gradient coil system can be fashioned without secondary coils since, due to the similarity of the magnetic field caused by the structure, the undesirable consequences of the gradient fields can be nearly completely controlled by a pre-distortion.

German PS 199 40 551 discloses a magnetic resonance apparatus with a basic field magnet with a two-part enclosure forming a bore. In the region of the enclosure in which the gradient coil system is attached, the enclosure is connected with a decoupling device that prevents the transfer of noise-generating oscillations from the gradient coil system to the enclosure of the basic field magnet.

From the subsequently published German OS 102 28 829, a magnetic resonance apparatus is known that has a basic field magnet with a bore that exhibits a shoulder (step). The gradient subassembly is clamped to this shoulder by means of a clamping element, such that a decrease in oscillation and a noise reduction are achieved.

SUMMARY OF THE INVENTION

An object of the present invention is to provide an improved magnetic resonance apparatus that in particular exhibits low noise emission characteristics.

This object is inventively achieved by a magnetic resonance apparatus having a basic field magnet with a bore that exhibits a bulge, and a mass augmentation that is attached in the bulge and that is composed of joined segments.

By means of the mass augmentation, the mass of the overall system tending to oscillation is increased, such that the amplitude of vibrations (and with it the noise as well) is reduced. The components connected with one another also exhibit high overall rigidity, such that the noise emission behavior of the magnetic resonance apparatus is positively influenced not only with regard to the amplitude, but also with regard to the frequencies of noise peaks.

DESCRIPTION OF THE PREFERRED EMBODIMENTS

Figure 1:
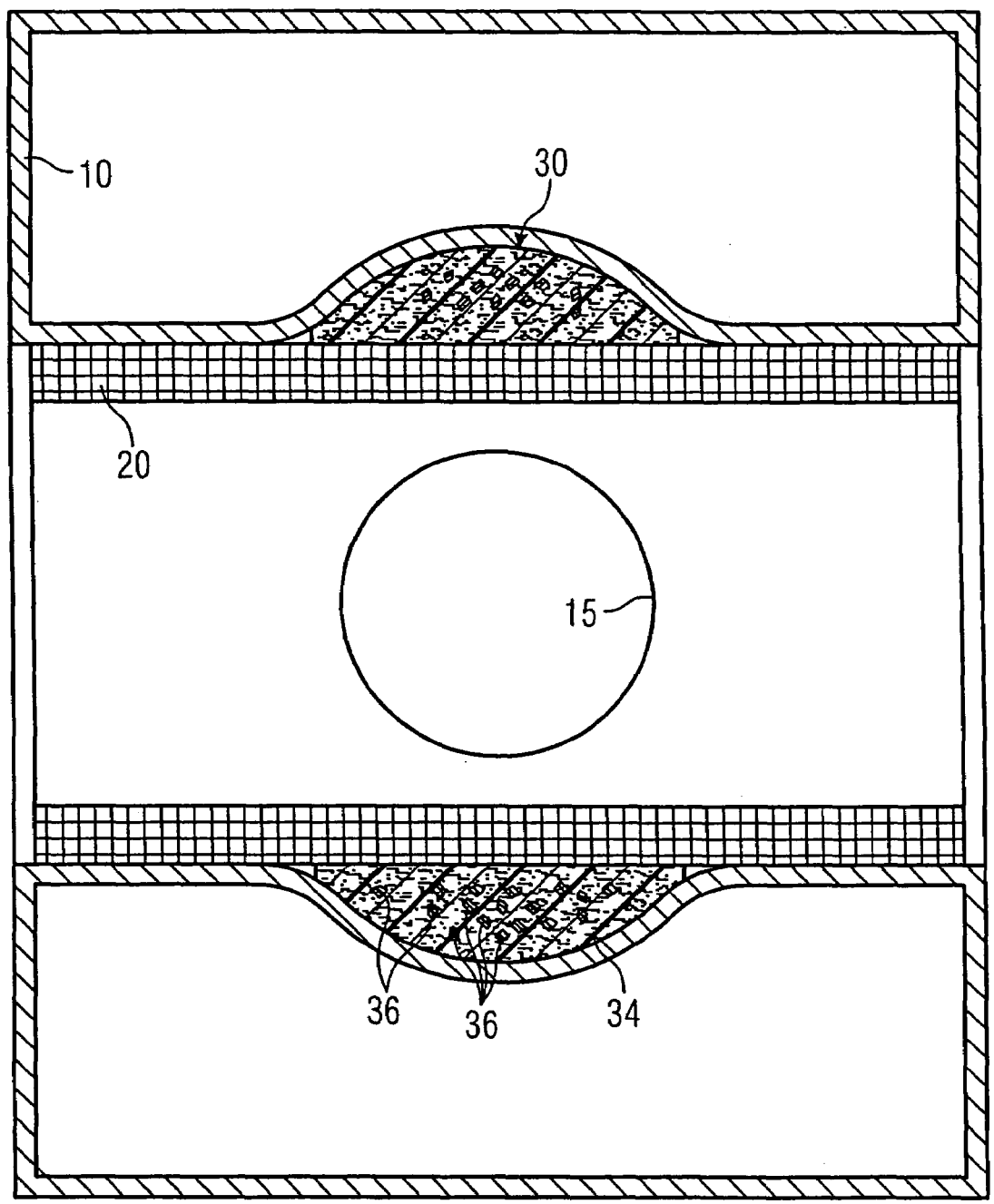
FIG. 1 is a longitudinal section through a magnetic resonance apparatus with a mass augmentation composed of segments, in accordance with the invention.

As an exemplary embodiment of the invention, FIG. 1 shows a longitudinal section through a magnetic resonance apparatus. To generate an optimally homogenous static basic magnetic field within an imaging volume 15, the magnetic resonance apparatus has a superconducting basic field magnet, the essentially hollow-cylindrical vacuum reservoir 10 of which is shown in FIG. 1 as an electrically-conductive structure. A non-actively shielded, essentially hollow-cylindrical gradient coil system 20 is disposed in the hollow bore of the vacuum reservoir 10. For clarity, further components of the magnetic resonance apparatus are not shown, for example, an antenna system to emit radio-frequency signals and to receive magnetic resonance signals.

The gradient coils of the gradient coil system 20 are designed in cooperation with the vacuum reservoir 10 corresponding to the concept of the previously cited German OS 101 56 770, such that a field resulting in the imaging volume 15 from the magnetic field generated by the gradient coil and an eddy current field generated by the vacuum reservoir 10 are adjusted immediately after a current change in one of the gradient coils. The resulting field exhibits the desired spatial distribution, in the form of a strong linear gradient field. For this purpose, the hollow bore of the vacuum reservoir 10 is bulged substantially like a barrel in the middle region thereof to implement the concept of German OS 101 56 770. By means of the pre-distortion, an undistorted resulting field can be set in the imaging volume 15.

Figure 2:
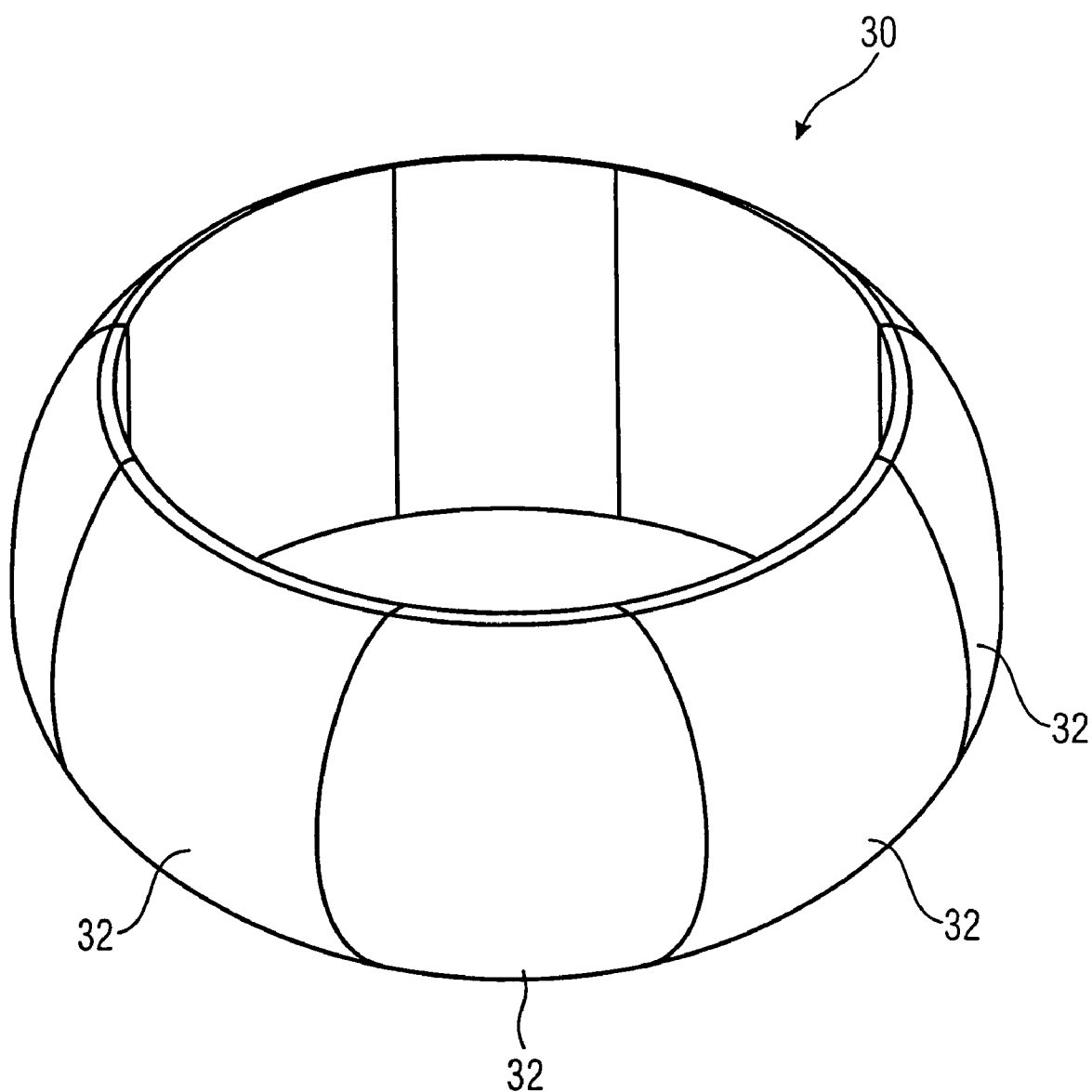
FIG. 2 shows the mass augmentation from FIG. 1, illustrating the segments, in a perspective view.

Particularly in the regions of the vacuum reservoir 10 forming the hollow bore, due to eddy currents induced during operation of the magnetic resonance apparatus, Lorentz forces act on these regions similar to the way they act on the gradient coils fed with current flowing through them, such that, without counter-measures, these regions of the vacuum reservoir 10 tend to oscillate and thereby cause noise. As a countermeasure, in the region of the bulge of the hollow bore between the vacuum reservoir 10 and the gradient coil system 20, a mass augmentation 30 composed of segments 32 is introduced that, as a strategically designed and placed mass, reduces the oscillation amplitudes. FIG. 2 shows the mass 30 of FIG. 1 pre-assembled from the segments 32 in a perspective view. The material of the mass augmentation 30 exhibits a high density (greater than approximately 1500 kg/m$^3$) and low cost, and furthermore is simple to process.

Since the mass augmentation 30 is to be inserted into the bore of the vacuum vessel 10 through an opening diameter that is smaller than the diameter of the assembled mass augmentation 30, the segments 32 are fashioned with regard to their size, shape and number such that they can be individually inserted (disassembled) from the outside into the bore and combined (assembled) in the bore. The combined segments 32 thereby conform to the geometry of the volume to be filled.

In an embodiment, the aforementioned segments 32 are produced by filling casting molds of suitable geometry with fluid epoxy resin that hardens (cures) into a thermoset plastic. Depending on whether a cold-hardening or warm-hardening casting resin is used, the curing ensues at room temperature or at elevated temperature. After hardening, casting resins exhibit a reaction contraction that, given large wall thicknesses, can lead to unwanted deformations and even to tears and bubbles in the component. To prevent these problems, a casting resin 34 containing filling material is used in accordance with the invention. The filling material content is between thirty and sixty volume percent. In particular, electrically insulating materials are suitable as filling materials, such as quartz, translucent fused quartz, aluminum oxide and/or barium sulfate is in the form of powder in the sub-millimeter range. Negative effects of the reaction contraction are further minimized by, before the casting, filling the hollow space of one of the casting molds up to a large portion with suitable palletized or powdered filling material 36 made from inert materials in the millimeter range. Upon casting, the casting resin 34 then fills only the intervening spaces (interspaces) and during the hardening produces a more secure bonding of the filling materials. After removal from the molds, the segments 32 exist in the desired form without further elaborate post-processing.

The individual segments 32 are affixed both with one another and with the vacuum reservoir 10 and the gradient coil system 20, by bonding or bracing, such that in operation of the magnetic resonance apparatus no additional unwanted noise development and no abrasion as a result of vibrations occur, and the overall rigidity of the connected components is advantageously increased.

In another embodiment, the segments 32 are produced from semi-finished products by machining a blank. For example, fabric-based laminate or paper-based laminate based on epoxy resin, phenol resin, silicon resin, melamine resin, polyester resin and mixtures of these are suitable as materials. Cotton fabric, fiberglass mats or fiberglass fabrics can be used as filling and reinforcement materials of the fabric-based laminate.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:
    a system, having a system mass, including a basic field magnet that is subject to mechanical oscillations, that have an amplitude, during operation of the system, said basic field magnet having a hollow interior bore exhibiting an outward bulge; and a mass augmentation, that augments said system mass, disposed in said bulge, comprised of a plurality of individual assembled segments, that reduces noise produced by said mechanical oscillations in said system by increasing the mass of said system and thereby reducing the amplitude of said mechanical oscillations.

2. A magnetic resonance apparatus as claimed in claim 1 wherein said mass augmentation is attached to said interior bore in said bulge by an attachment technique selected from the group consisting of bonding and bracing.

3. A magnetic resonance apparatus as claimed in claim 1 wherein said bulge forms a chamber in said interior bore of said basic field magnet.

4. A magnetic resonance apparatus as claimed in claim 3 wherein said segments are disassembleable in order to enable individual insertion into said bore from an exterior of said bore, and are assembled in said chamber.

5. A magnetic resonance apparatus as claimed in claim 1 wherein said segments are composed of a laminate based on a resin, said laminate being selected from the group consisting of fabric-based laminates and paper-based laminates.

6. A magnetic resonance apparatus as claimed in claim 5 wherein said segments comprise filling and reinforcement materials selected from the group consisting of cotton fabric, fiberglass mats and fiberglass fabrics.

7. A magnetic resonance apparatus as claimed in claim 5 wherein said resin is composed of at least one resin selected from the group consisting of epoxy resins, phenol resins, silicon resins, melamine resins, and polyester resins.

8. A magnetic resonance apparatus as claimed in claim 1 wherein said segments are components machined from a blank.

9. A magnetic resonance apparatus as claimed in claim 1 wherein said segments are cast bodies produced from a casting resin.

10. A magnetic resonance apparatus as claimed in claim 9 wherein said cast bodies comprise fillers.

11. A magnetic resonance apparatus as claimed in claim 10 wherein said fillers comprise material palletized in a millimeter range or larger.

12. A magnetic resonance apparatus as claimed in claim 10 wherein said fillers comprise material pulverized in a sub-millimeter range added to said casting resin.

13. A magnetic resonance apparatus as claimed in claim 10 wherein said fillers comprise an electrically insulating material selected from the group consisting of quartz, translucent fused quartz, aluminum oxide, barium sulfate and glass.

14. A magnetic resonance apparatus as claimed in claim 1 wherein said mass augmentation has a density of greater than approximately 1500 kg/m$^3$.

15. A magnetic resonance apparatus as claimed in claim 1 comprising a gradient coil system that generates a gradient field, and wherein said basic field magnet, during said operation, has eddy currents flowing therein that generate an eddy current field by interaction with said gradient field, and wherein said bulge is disposed in said interior bore of said basic field magnet at a location and with a size and shape that causes said eddy current field to be geometrically similar to said gradient field.

16. A magnetic resonance apparatus as claimed in claim 15 wherein said basic field magnet is a superconducting magnet having a vacuum reservoir, and wherein said bulge is disposed in an exterior wall of said vacuum reservoir.

17. A magnetic resonance apparatus as claimed in claim 1 wherein said bulge has a barrel-shape.

18. A magnetic resonance apparatus as claimed in claim 15 wherein said bulge has a barrel-shape.

19. A magnetic resonance apparatus as claimed in claim 15 wherein said gradient coil system is disposed in said interior bore of said basic field magnet.

20. A magnetic resonance apparatus as claimed in claim 19 wherein said mass augmentation is connected to said gradient coil system.

21. A magnetic resonance apparatus as claimed in claim 19 wherein said gradient coil system has a hollow cylindrical shape.

* * * * *